United States Patent
Pathak et al.

(10) Patent No.: US 8,887,017 B2
(45) Date of Patent: Nov. 11, 2014

(54) PROCESSOR SWITCHABLE BETWEEN TEST AND DEBUG MODES

(71) Applicant: Freescale Semiconductor, Inc., Austin, TX (US)

(72) Inventors: Akshay K. Pathak, Noida (IN); Rakesh Pandey, Ghaziabad (IN)

(73) Assignee: Freescale Semiconductor, Inc., Austin, TX (US)

( * ) Notice: Subject to any disclaimer, the term of this patent is extended or adjusted under 35 U.S.C. 154(b) by 92 days.

(21) Appl. No.: 13/650,141

(22) Filed: Oct. 12, 2012

(65) Prior Publication Data
US 2014/0108876 A1  Apr. 17, 2014

(51) Int. Cl.
*G01R 31/28* (2006.01)

(52) U.S. Cl.
USPC .......................................................... 714/727

(58) Field of Classification Search
CPC .............. G01R 31/318555; G01R 31/318572; G01R 31/318541; G01R 31/318536; H05K 999/99
USPC .......................................................... 714/727
See application file for complete search history.

(56) References Cited

U.S. PATENT DOCUMENTS

| 6,112,298 A * | 8/2000 | Deao et al. ..................... 712/227 |
| 7,844,997 B2 | 11/2010 | Tucker |
| 2008/0091989 A1 | 4/2008 | Bakshi |
| 2009/0134904 A1 * | 5/2009 | Zjajo et al. ..................... 324/765 |
| 2012/0036406 A1 * | 2/2012 | Whetsel ......................... 714/727 |
| 2013/0332787 A1 * | 12/2013 | Swoboda ....................... 714/727 |

OTHER PUBLICATIONS

Rosenfeld, Kurt and Ramesh Karri, Attacks and Defenses for JTAG, IEEE Design & Test of Computers, 2010.

* cited by examiner

*Primary Examiner* — Albert Decady
*Assistant Examiner* — Enam Ahmed
(74) *Attorney, Agent, or Firm* — Charles Bergere

(57) ABSTRACT

A processor includes a TCU TAP for access of a TCU for running functional tests and a DAP TAP for access of a debugger. A TAP selection module selects reversibly TAP access by default through the TCU TAP when the processor is a bare die, or by default through the DAP TAP when the processor is packaged, the selection of TAP access being reversible by the TCU. The processor also includes a fuse for irreversibly disabling the selection by the TAP selection module of the TAP access by default through the TCU TAP. Functional tests on bare dies are run with a TCU probing the dies through the TCU TAP by default. Packaged engineering samples can be supplied for debugging with the DAP TAP selected by default, but access possible for the TCU through the TCU TAP.

14 Claims, 2 Drawing Sheets

PROCESSOR SWITCHABLE BETWEEN TEST AND DEBUG MODES

BACKGROUND OF THE INVENTION

The present invention is directed to electronic circuits and, more particularly, to a processor that is switchable between a test mode and a debug mode of operation, in addition to a functional mode of operation.

Development of a new processor or of an evolution of an existing processor requires testing of the combinational logic of the circuits of the processor in a test mode, and debugging of programs installed in the processor in a debug mode. Testing is commonly performed by automatic test equipment (ATE) having a test controller unit (TCU) through a TCU test access port (TAP) of the processor. Debugging is performed through a debug access port (DAP) TAP. The DAP TAP also may be used for programming or re-programming software in the processor.

Testing of the processor at the fab is typically performed on the wafer, the test machine connecting with individual devices in the array of bare dies on the wafer through probes contacting pads on the devices. After packaging, the devices are typically tested again, in 'final test', the test machine connecting with the devices through external contacts (pins) on the package, to check the impact of the packaging on performance and to diagnose any packaging related defects such as faulty connections and other defects that can only be tested on packaged parts. The TCU TAP includes physical internal connections, logic elements and software to enable the test machine to apply test signals or instructions to the device placing the modules of the device in specific test configurations and putting the device through specific test routines instead of its normal functional operation. To facilitate the testing, the devices may include boundary scan resources, and/or built-in self test (BIST) modules enabling stimulus generation and measurements to be performed in the device itself. Typically, once development and testing of the device are complete, a physical or logic test fuse is blown. Blowing the fuse switches the device irreversibly from the test mode to a secure mode, where the TCU TAP can no longer be used, for example for unauthorized access to data stored in the device, and enables parts to be delivered safely to users.

Debugging of processors is typically performed after packaging. The debugging process may include detecting anomalies (such as logical or synchronization problems in the software code, or a design error in the hardware), diagnosing their cause (including running a program step by step, breaking the program at a particular event or specified instruction, and tracking the values of variables, for example), assessing their impact, and implementing software patches updating or adding software modules to a system. The DAP TAP in the device typically includes hardware and software elements for communicating with a debugger and executing the processes defined by the debugger. A packaged processor typically includes a few pins that are specific to the DAP TAP, commonly between two and five pins, in addition to the power supply and input/output (I/O) pins of the device for its normal functional operation.

One common tool for debug access to packaged devices is the Joint Test Action Group (JTAG), IEEE standard 1149.1. JTAG is a basic means of accessing sub-blocks of the device. A DAP TAP in a JTAG capable device may include a JTAG adapter module or in-circuit emulator (ICE) to access on-chip debug modules inside the processor through a user interface (UI) on a terminal. Another tool for debug access to packaged devices is the Background Debug Mode (BDM).

JTAG can also be used during testing to manipulate the boundary scan links in the device through its I/O pins, to manipulate interfaces in the device to internal registers and test the combinational logic of the device, and to activate BIST modules in the device.

Development of processors can be prolonged and even sequencing and programming an algorithm for blowing a test fuse may cause significant additional delay. It would be desirable to be able to supply a limited quantity of engineering samples for software development, evaluation and validation before the test fuse is blown. Such engineering samples should restrict access by users in the debug mode to the DAP TAP, the TCU TAP being only accessible to the TCU for the test mode, while still allowing the ATE to select access through either the TCU TAP or the DAP TAP.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF THE INVENTION

Figure 1:
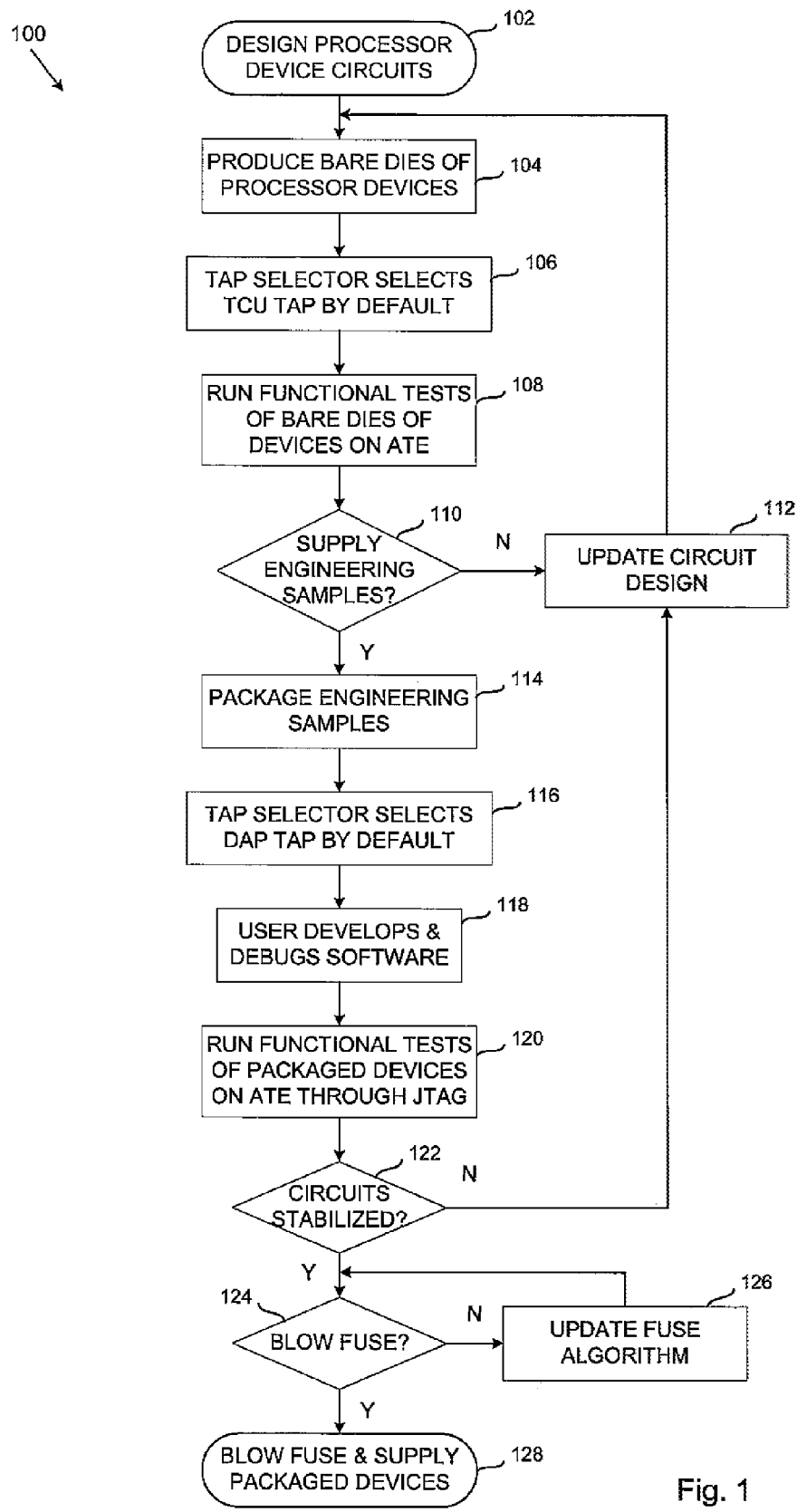
FIG. 1 is a flow chart of a method of making processors in accordance with an embodiment of the invention, given by way of example.
Figure 2:
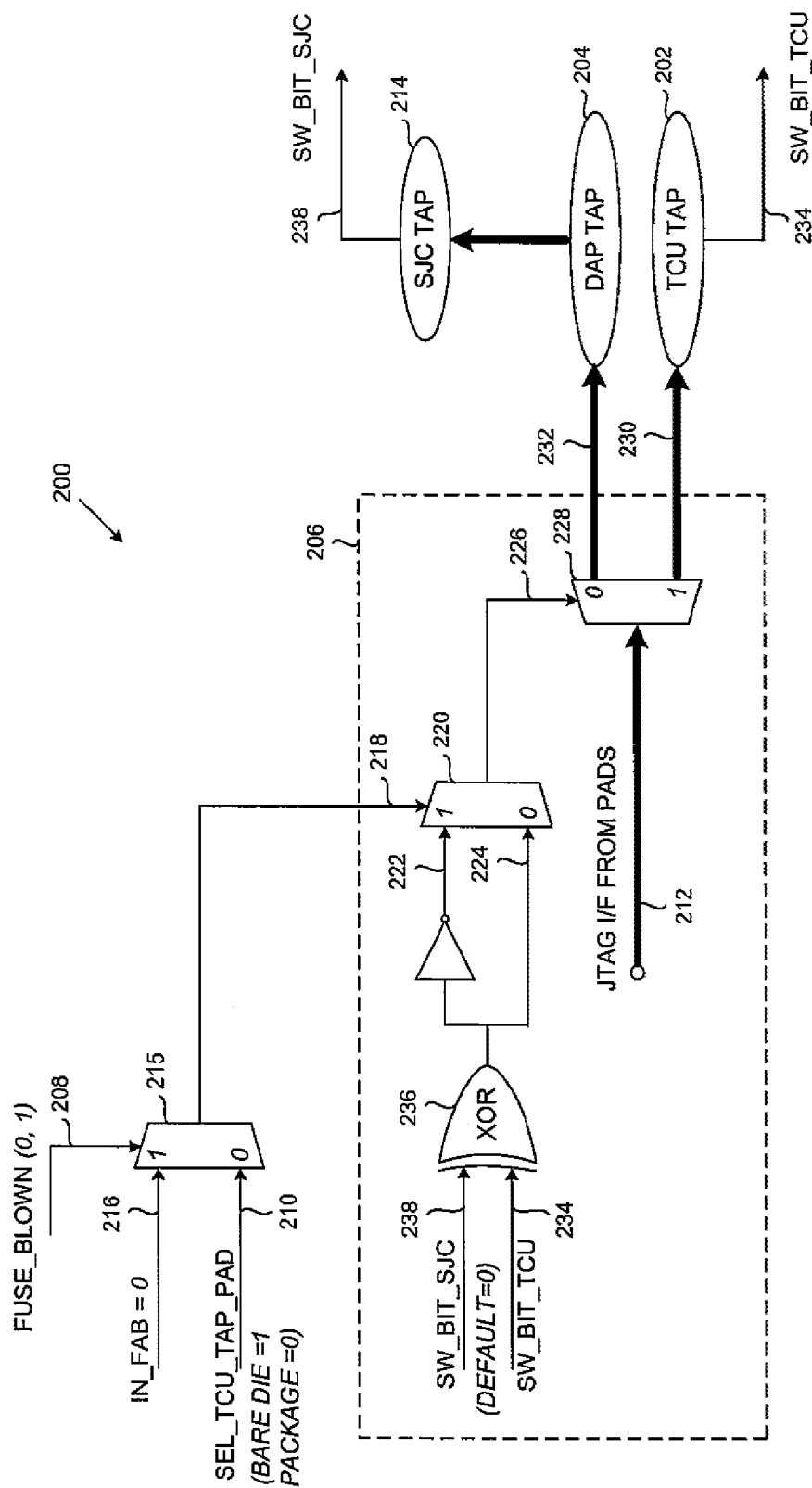
FIG. 2 is a schematic diagram of TAP access ports and a TAP selection module in a processor in accordance with an embodiment of the invention, given by way of example.

FIG. 1 illustrates a method 100 of making processors in accordance with an embodiment of the invention, given by way of example and FIG. 2 illustrates TAP access ports and a TAP selection module in a processor 200 in accordance with an embodiment of the invention, given by way of example. The processor 200 comprises a TCU TAP 202 for enabling access of a TCU to internal modules of the processor 200 for running functional tests of the modules. The processor 200 also includes a DAP TAP 204 for enabling access of a debugger to the processor 200 to debug and program software in the processor 200. The processor 200 also includes a TAP selection module 206 for selection of TAP access by default through the TCU TAP 202 when the device 200 is a bare die, or by default through the DAP TAP 204 when the device 200 is packaged, the selection of the TAP access being reversible as a function of a TAP switch signal SW_BIT_SJC, SW_BIT_ TCU controllable by the TCU. The processor 200 also includes a fuse 208, 216 for irreversibly disabling the selection by the TAP selection module 206 of the TAP access by default through the TCU TAP 202.

The method 100 comprises running functional tests with a TCU probing the devices when the devices 200 are bare dies and with the TAP selection module 206 selecting the TCU TAP 202 by default. The method 100 also comprises providing at least a first batch of the devices 200 packaged, with the DAP TAP 204 selected by default and with the fuse 208 deactivated enabling access to the devices 200 by a debugger and by a TCU through the DAP TAP 204, the TCU being able to control the TAP switch signals SW_BIT_SJC, SW_BIT_ TCU through the DAP TAP 204 for the TAP selection module 206 to select access through the TCU TAP 202. The method 100 also includes providing further batches of the devices 200 packaged, with the DAP TAP 204 selected by default, and with the fuse 208 activated to disable irreversibly the selection by the TAP selection module 206 of the TAP access by default through the TCU TAP 202.

It will be understood that the expression 'selection by default' includes the selection made when the processor is first powered up, before external signals or instructions alter the selection. The functional tests when the devices 200 are bare dies may be run with a TCU probing the devices on a wafer. Also, the term packaging refers to the die after it has been attached and electrically connected to a carrier such a lead frame or substrate and covered with a plastics material, as is known in the art.

In this example of the method 100 and of the processor 200, when the device is a bare die the TAP selection module 206 is operable to select by default the TAP access through the TCU TAP 202 as a function of a TAP selection signal SEL_TCU_TAP_PAD at a TAP selection pad 210 of the device. When the device 200 is a bare die, the TAP selection signal SEL_TCU_TAP_PAD has a value such that the TAP selection module 206 selects the TAP access through the TCU TAP 202 by default. After packaging and providing external pins for electrical connection to the device, the TAP selection signal SEL_TCU_TAP_PAD has a value such that the TAP selection module 206 selects the TCU access and the debugger access through the DAP TAP 204 by default, the TAP selection pad 210 of the device being inaccessible from the external pins. After packaging, the TAP selection module 206 is controllable to select reversibly the TAP access through the TCU TAP 202 or through the DAP TAP 204 by values of the TAP switch signal SW_BIT_SJC, SW_BIT_TCU controllable by the TCU from an external pin 212 of the device and acting through the DAP TAP 204 or through the TCU TAP 202. The TAP switch signal SW_BIT_SJC, SW_BIT_TCU is controllable to select reversibly the TCU access through the TCU TAP 202 is controllable by JTAG signals or instructions applied by the TCU at the external pin 212 of the device. The TAP switch signal SW_BIT_SJC, SW_BIT_TCU is controllable by the JTAG signals or instructions through the DAP TAP 204 and through a secure JTAG controller ('SJC') module 214 of the device.

In more detail, this example of the method 100 of making processors starts at 102 by designing the circuits of the processors 200. At 104, processors 200 are provided as bare dies, in this case on wafer, and at 106 the TAP selection module 206 selects TAP access of the TCU through the TCU TAP 202 by default. A TCU in an ATE runs functional tests of the bare dies by probing the pads of the dies at 108. At 110, depending on the results of the functional tests, a decision is taken whether to update the circuit design at 112, in which case fresh processors 200 are provided as bare dies at 104. If the decision at 110 is to provide packaged processors 200 as engineering samples at 114, the TAP selection module 206 selects TAP access through the DAP TAP 204 by default at 116. The packaged processors 200 may also be subjected to final test (not shown) on an ATE at this stage. The engineering samples are supplied to users for program development and debugging at 118. Functional tests may be run on the packaged processors 200 on an ATE at 120 through the external pin 212 and a JTAG interface, to detect any defects in parts returned by the users, for example, since ATE testing is based on VCD format and does not require any debugger support nor third party provider involvement. At 122, a decision is taken whether the circuit design is stabilized and, if not, the process returns to updating the circuit design at 112. If at 122 the decision is that the circuit design is stable, a decision is taken at 124 whether to blow the fuse 208. If the algorithm for blowing the fuse 208 is not yet stable, the algorithm is updated at 126. Otherwise, the fuse is blown at 128 and commercial production quantities of the packaged processors 200 are supplied at 128.

Referring now to FIG. 2, the fuse 208 includes a multiplexer 215 having a first input 210 which receives the TAP selection signal SEL_TCU_TAP_PAD from the TAP selection pad 210 and a second input 216 which receives a signal IN_FAB held de-asserted until the manufacturing and final test process is complete. A control input 208 of the multiplexer 215 receives a value FUSE_BLOWN which is asserted when the fuse can be blown and is de-asserted otherwise. The assertion of the value FUSE_BLOWN is defined in this example by an algorithm applied to products supplied on a commercial basis, although it is also possible for the value FUSE_BLOWN to be defined by a physically blowing a connection, by a laser, for example. When the value FUSE_BLOWN is asserted, the output of the multiplexer 215 can be irreversibly de-asserted. Until the value FUSE_BLOWN is asserted, the output of the multiplexer 215 is a function of the TAP selection signal SEL_TCU_TAP_PAD on the TAP selection pad 210.

The output of the multiplexer 215 is applied to a control input 218 of a multiplexer 220 in the TAP selection module 206. The multiplexer 220 has a first data input 222, a second data input 224, and an output 226. The output 226 is equal to the signal on the first data input 222 when the control input 218 is asserted, and is equal to the signal on the second data input 224 when the control input 218 is de-asserted. The output 226 is applied to a control input of a de-multiplexer 228 which has a data input connected through a JTAG interface (not shown) to receive JTAG signals or instructions applied at the external pin 212 of the device. The de-multiplexer 228 has a first output 230 connected to the TCU TAP 202 and a second output 232 connected to the DAP TAP 204. The first output 230 is equal to the signal on the pin 212 when the control input 226 is asserted, and the second output 232 is equal to the signal on the pin 212 when the control input 218 is de-asserted.

The TCU TAP 202 controls the TAP switch signal SW_BIT_TCU on a first input 234 to an exclusive OR ('XOR') logic circuit 236, and the DAP TAP 204 controls the TAP switch signal SW_BIT_SJC on a second input 238 to the XOR circuit 236, as a function of specific JTAG signals or instructions applied at the external pin 212 of the device 200. In the absence of signals at the external pin 212, and in particular when the processor 200 is powered up, the TAP switch signals SW_BIT_TCU and SW_BIT_SJC assume their default values, in which they are de-asserted. The output of the XOR circuit 236 is connected through an inverter 240 to the first input 222 of the multiplexer 220 and is connected directly to the second input 224 of the multiplexer 220.

The TAP selection pad 210 is a dummy pad, that is to say that it is not connected to an input/output ('I/O') pin in the processor 200 when packaged, nor controlled by a probe when the device is a bare die. When the processors 200 are bare dies, a resistor (not shown) connected between a rail at a voltage Vdd and the TAP selection pad 210 pulls up the voltage of the TAP selection pad 210 so as to assert the TAP selection signal SEL_TCU_TAP_PAD. When the processors 200 are packaged, the TAP selection pad 210 is tied to Vss (ground), by connection through a double bond wire to a pin used to supply power to the processor 200 through another pad (not shown), so as to de-assert the TAP selection signal SEL_TCU_TAP_PAD on packaged parts without requiring an additional pin.

Until the value FUSE_BLOWN is asserted, the control input 218 of the multiplexer 220 receives the TAP selection signal SEL_TCU_TAP_PAD from the output of the multiplexer 215. When the processor 200 is a bare die, the TAP selection signal SEL_TCU_TAP_PAD is asserted and the output of the multiplexer 220 is equal to its first input 222. The default value at the first input 222 is asserted, since the default values of the TAP switch signals SW_BIT_TCU and SW_BIT_SJC are both de-asserted, the output of the XOR circuit 236 is de-asserted, and the output of the inverter 240 is asserted. The asserted output of the multiplexer 220 is applied to the control input 226 of the de-multiplexer 228, whose first output 230 is then equal to the signals or instructions from the JTAG interface on the pin 212, and is supplied to the TCU TAP 202. The TCU can alter this default selection of the TCU TAP 202 by asserting the TAP switch signal SW_BIT_TCU through the TCU TAP 202, in which case the output of the XOR circuit 236 becomes asserted, and the output of the inverter 240 de-asserted. The de-asserted output of the multiplexer 220 is applied to the control input 226 of the de-multiplexer 228, whose second output 230 is then equal to the signals or instructions from the JTAG interface on the pin 212, and is supplied to the DAP TAP 204. The TCU can reverse this altered selection by asserting the TAP switch signal SW_BIT_SJC through the DAP TAP 204, in order to select again TAP access through the TCU TAP 202.

Until the value FUSE_BLOWN is asserted, when the processor 200 is packaged, the output of the multiplexer 215 is equal to the TAP selection signal SEL_TCU_TAP_PAD, which is de-asserted and the output of the multiplexer 220 is equal to its second input 224. The default value at the second input 224 is de-asserted, since the default values of the TAP switch signals SW_BIT_TCU and SW_BIT_SJC are both de-asserted and the output of the XOR circuit 236 is de-asserted. The de-asserted output of the multiplexer 220 is applied to the control input 226 of the de-multiplexer 228, whose second output 232 is then equal to the signals or instructions from the JTAG interface on the pin 212, and is supplied to the DAP TAP 204. Debugger access is assured through the pin 212, the JTAG interface and the DAP TAP 204. For testing on an ATE, the TCU can alter this default selection of the DAP TAP 204 by asserting the TAP switch signal SW_BIT_SJC through the DAP TAP 204, in which case the output of the XOR circuit 236 becomes asserted. The asserted output of the multiplexer 220 is applied to the control input 226 of the de-multiplexer 228, whose first output 230 is then equal to the signals or instructions from the JTAG interface on the pin 212, and is supplied to the TCU TAP 202. The TCU can reverse this altered selection by asserting the TAP switch signal SW_BIT_TCU through the TCU TAP 202, in order to select again TAP access through the TCU TAP 202. No debugger support is required for the TCU to alter the TAP selection through the DAP TAP 204, since the TCU signals are based on value change dump (VCD) format.

Relying on the TAP selection signal SEL_TCU_TAP_PAD to limit TAP access to the DAP TAP 204 for commercial production processors 200 would pose a security risk of interference with the double bond of the TAP selection pad 210. The TAP selection signal SEL_TCU_TAP_PAD is only used to limit TAP access to the DAP TAP 204 while the value FUSE_BLOWN is de-asserted, until the fuse blowing procedure is mastered. Once the value FUSE_BLOWN is asserted, TAP access is controlled by the input IN_FAB. The output of the multiplexer 215 and the control input 218 of the multiplexer 220 become equal to the input IN_FAB, whose default value is de-asserted, and the output of the multiplexer 220 is equal to its second input 224. The default value at the second input 224 is de-asserted, the de-asserted output of the multiplexer 220 is applied to the control input 226 of the de-multiplexer 228, whose second output 232 is then equal to the signals or instructions from the JTAG interface on the pin 212, and is supplied to the DAP TAP 204 and debugger access is assured through the pin 212, the JTAG interface and the DAP TAP 204, as described above. For testing on an ATE, the TCU can alter this default selection of the DAP TAP 204 reversibly, by asserting the TAP switch signal SW_BIT_SJC through the DAP TAP 204, and then by asserting the TAP switch signal SW_BIT_TCU through the TCU TAP 202, in order to select again TAP access through the TCU TAP 202.

When the input IN_FAB is asserted with the value FUSE_BLOWN asserted, access through the TCU TAP 204 becomes impossible and only TAP access through the DAP TAP 204 is possible. The output of the multiplexer 220 is equal to its first input 222 and assertion of either of the TAP switch signals SW_BIT_TCU and SW_BIT_SJC would de-assert the output of the multiplexer 220. The output of the multiplexer 220 is applied to the control input 226 of the de-multiplexer 228, whose second output 232 is then equal to the signals or instructions from the JTAG interface on the pin 212, and is supplied to the DAP TAP 204, not the TCU TAP 202, and in addition, the clock of the TCU TAP 202 is blocked.

It will be appreciated that the processor 200 enables engineering samples to be supplied to validation engineers and customers, for example, to validate the design and develop and debug programs before the fuse programming algorithm is stabilized and the fuse blown. This can save several weeks to months of waiting, improving the time to market.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice-versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A processor, comprising:
   a test controller unit (TCU) test access port (TAP) for enabling access of a TCU to internal modules of the processor for running functional tests of the modules;
   a debug access port (DAP) TAP for enabling access of a debugger to the processor to debug and program software in the processor;
   a TAP selection module for selection of TAP access by default through said TCU TAP when the processor is a bare die, or by default through said DAP TAP when the processor is packaged, wherein said TAP selection module is controllable to select reversibly said TAP access through said TCU TAP or through said DAP TAP by values of a TAP switch signal controllable by said TCU from an external pin of the processor and provided through said TCU TAP or DAP TAP through which said TAP selection module is acting; and
   a fuse for irreversibly disabling said selection by said TAP selection module of said TAP access by default through said TCU TAP.

2. The processor of claim 1, wherein when the processor is a bare die said TAP selection module is operable to select by default said TAP access through said TCU TAP as a function of a TAP selection signal at a TAP selection pad of the processor.

3. The processor of claim 2, wherein when the processor is a bare die said TAP selection signal has a value such that said TAP selection module selects said TAP access through said TCU TAP by default.

4. The processor of claim 2 after packaging, and including external pins for electrical connection to the processor, wherein said TAP selection signal has a value such that said TAP selection module selects said TAP access through said DAP TAP by default, said TAP selection pad of the processor being inaccessible from said external pins.

5. The processor of claim 1 after packaging, wherein said TAP switch signal is controllable by Joint Test Action Group (JTAG) signals or instructions applied by said TCU at said external pin of the processor.

6. The processor of claim 5 after packaging, wherein said TAP switch signal is controllable by said JTAG signals or instructions through said DAP TAP and through a secure JTAG module of the device.

7. A processor, comprising:
   external pins for electrical connection thereto;
   a test controller unit (TCU) test access port (TAP) for enabling access of a TCU to internal modules of the processor for running functional tests of the modules;
   a debug access port (DAP) TAP for enabling debugger access to debug software in the processor;
   a TAP selection module for selection of TAP access by default through said TCU TAP when the processor is a bare die, or by default through said DAP TAP when the processor is packaged, wherein said TAP selection module is controllable to select reversibly said TAP access through said TCU TAP or through said DAP TAP by values of a TAP switch signal controllable by said TCU from an external pin of the processor and provided through said TCU TAP or DAP TAP through which said TAP selection module is acting;
   wherein said TAP selection module is operable when the processor is a bare die to select by default said TAP access through said TCU TAP as a function of a first value of a TAP selection signal at a TAP selection pad of the processor, said TAP selection pad being inaccessibly from said external pins after packaging, and said TAP selection signal having a second value after packaging of the processor such that said TAP selection module selects by default said TAP access through said DAP TAP; and a fuse for irreversibly disabling said selection by said TAP selection module of said TAP access by default through said TCU TAP.

8. The processor of claim 7, wherein said fuse is activated to disable irreversibly said selection by said TAP selection module of said TAP access by default through said TCU TAP.

9. A method of making a processor including a test controller unit (TCU) test access port (TAP) for enabling access of a TCU to internal modules of the processor for running functional tests of the modules, a debug access port (DAP) TAP for enabling access of a debugger to the processor to debug and program software in the processor, a TAP selection module for selection of TAP access by default through said TCU TAP when the processor is a bare die, or by default through said DAP TAP when the processor is packaged, wherein said TAP selection module is controllable to select reversibly said TAP access through said TCU TAP or through said DAP TAP by values of a TAP switch signal controllable by said TCU from an external pin of the processor and provided through said TCU TAP or DAP TAP through which said TAP selection module is acting, and a fuse for irreversibly disabling said selection by said TAP selection module of said TAP access by default through said TCU TAP, the method comprising:

running functional tests with a TCU probing the processor when the processor is a bare die and with said TAP selection module selecting access of said TCU through said TCU TAP by default;

providing at least a first batch of the processors packaged, with said DAP TAP selected by default and with said fuse deactivated enabling access to the devices by a debugger and by a TCU through said DAP TAP, said TCU being able to control said TAP switch signals through said DAP TAP for said TAP selection module to select access through said TCU TAP; and providing further batches of the processors packaged, with said DAP TAP selected by default, and with said fuse activated to disable irreversibly said TAP selection module and access through said TCU TAP.

10. The method of claim 9, wherein running functional tests with a TCU probing the processor when the processor is a bare die includes said TAP selection module selecting by default said TAP access through said TCU TAP as a function of a TAP selection signal at a TAP selection pad of the die.

11. The method of claim 10, wherein when the processor is a bare die, and said TAP selection signal has a value such that said TAP selection module selects said TAP access through said TCU TAP by default.

12. The method of claim 10, further comprising:

packaging the processor and providing external pins for electrical connection to the processor, wherein said TAP selection signal has a value such that said TAP selection module selects said TAP access through said DAP TAP by default, said TAP selection pad of the processor being inaccessible from said external pins.

13. The method of claim 9, wherein said TAP switch signal is controllable by one of Joint Test Action Group (JTAG) signals and instructions applied by said TCU at said external pin of the device.

14. The method of claim 9, wherein said TAP switch signal is controllable by one of said JTAG signals and instructions through said DAP TAP and through a secure JTAG module of the processor.

* * * * *